United States Patent
Sczyrba et al.

(12)

(10) Patent No.: US 8,257,888 B2
(45) Date of Patent: Sep. 4, 2012

(54) PARTICLE BEAM WRITING METHOD, PARTICLE BEAM WRITING APPARATUS AND MAINTENANCE METHOD FOR SAME

(75) Inventors: Martin Sczyrba, Dresden (DE); Christian Buergel, Dresden (DE); Eugen Foca, Radebeul (DE)

(73) Assignee: Advanced Mask Technology Center GmbH + Co. KG (DE)

( * ) Notice: Subject to any disclaimer, the term of this patent is extended or adjusted under 35 U.S.C. 154(b) by 362 days.

(21) Appl. No.: 12/605,949

(22) Filed: Oct. 26, 2009

(65) Prior Publication Data

US 2010/0104961 A1    Apr. 29, 2010

(30) Foreign Application Priority Data

Oct. 24, 2008   (DE) .......................... 10 2008 053 180

(51) Int. Cl.
*G03F 9/00*    (2006.01)
(52) U.S. Cl. ............................ 430/30; 430/296; 430/942
(58) Field of Classification Search .................... 430/30, 430/296, 942
See application file for complete search history.

(56) References Cited

U.S. PATENT DOCUMENTS

| 2006/0255284 A1 | 11/2006 | Hill et al. |
| 2007/0114453 A1 | 5/2007 | Emi et al. |

FOREIGN PATENT DOCUMENTS

| DE | 27 55 399 C2 | 6/1978 |
| DE | 10 2007 056 242 A1 | 6/2008 |
| JP | 2004-158630 | 6/2004 |
| JP | 2004-311809 | 11/2004 |
| JP | 2006-032613 | 2/2006 |

OTHER PUBLICATIONS

German International Search Report dated Mar. 12, 2009.

*Primary Examiner* — Christopher Young
(74) *Attorney, Agent, or Firm* — Mayback & Hoffman, P.A.; Gregory L. Mayback; Thomas Bethea

(57) ABSTRACT

A first exposure dose for a shot area based upon layout data is determined. A correction dose compensating a dose deviation between a first point in time, at which a control unit configured to control a shot time period of a particle beam writing apparatus considers a charged particle beam as having reached a nominal current density, and a second point in time, at which the charged particle beam has actually reached a nominal current density, at a target substrate is determined.

16 Claims, 4 Drawing Sheets

Figure 1:
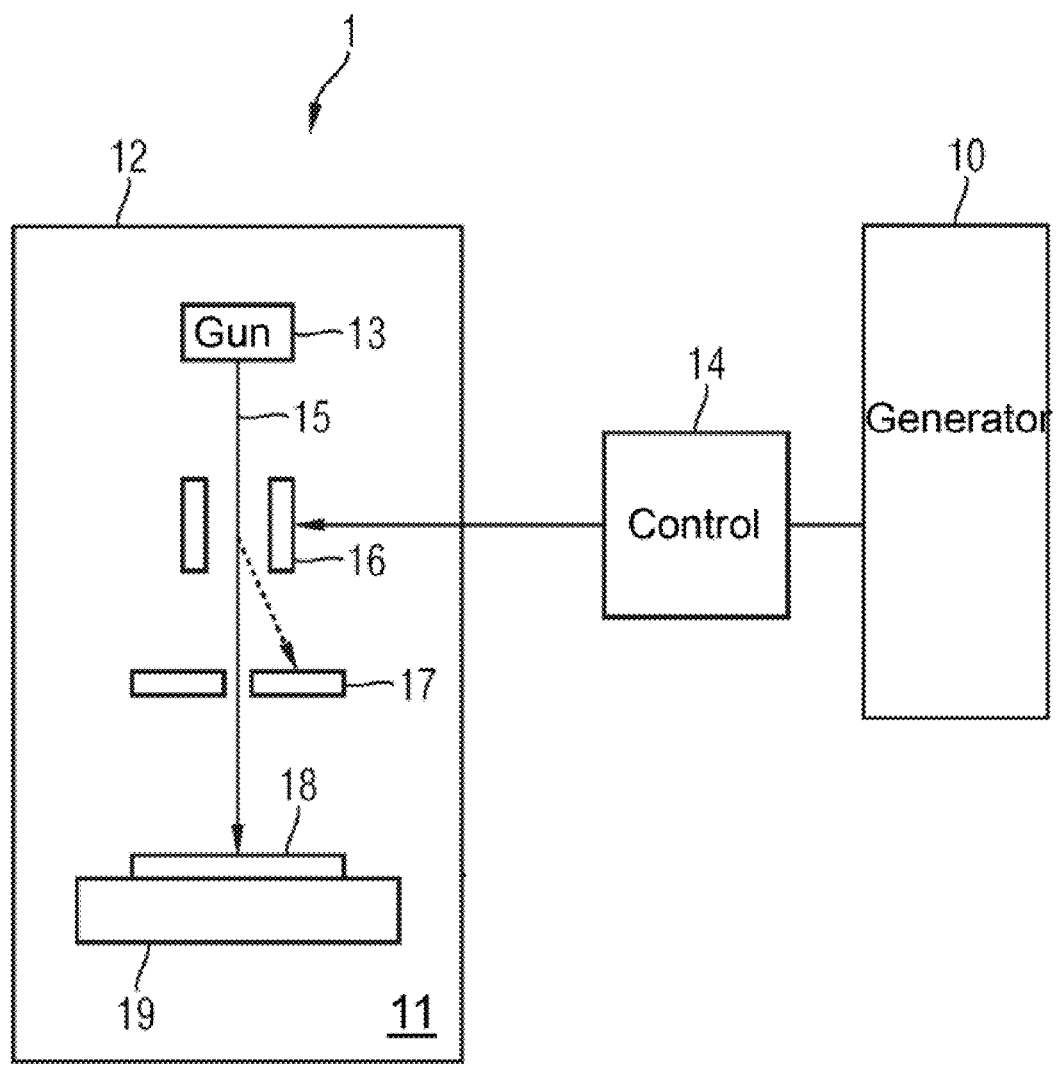

PARTICLE BEAM WRITING METHOD, PARTICLE BEAM WRITING APPARATUS AND MAINTENANCE METHOD FOR SAME

BACKGROUND OF THE INVENTION

A resist-coated substrate for mask manufacturing may be structured by a particle beam writing apparatus. An exposure of the resist includes a sequence of shots. During each shot a particle beam, for example an electron beam, an ion beam or another particle beam, is directed to the resist-coated substrate. The resist is sensitive to an irradiation with the particles and changes its chemical properties. A particle beam pattern generator determines size, shape and dose for each single shot based upon a layout data pattern. The details of each shot, for example shot area, shape, dose and exposure sequence, and hence the control of the particle beam writing apparatus determine the required writing strategy.

For a vector scan shaped particle beam writing apparatus, a shot definition includes positioning the particle beam and selecting an aperture of an illumination system to determine shape and size of the shot area. Then the particle beam is turned on for a time calculated from the dose required for patterning the resist in the respective spot area and from a nominal particle beam density, for example a nominal current density. Dose deviations may result, for example, in line width aberrations. A need exists for a particle beam exposure method with high throughput and high yield.

A further need exists for improved particle beam writing methods compensating, for example, resist heating effects or dose variations, at high throughput.

Although the invention is illustrated and described herein as embodied in a particle beam writing method, a particle beam writing apparatus, and a maintenance method for the same, it is, nevertheless, not intended to be limited to the details shown because various modifications and structural changes may be made therein without departing from the spirit of the invention and within the scope and range of equivalents of the claims. Additionally, well-known elements of exemplary embodiments of the invention will not be described in detail or will be omitted so as not to obscure the relevant details of the invention.

Other features that are considered as characteristic for the invention are set forth in the appended claims. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure. Further, the terms and phrases used herein are not intended to be limiting; but rather, to provide an understandable description of the invention. While the specification concludes with claims defining the features of the invention that are regarded as novel, it is believed that the invention will be better understood from a consideration of the following description in conjunction with the drawing figures, in which like reference numerals are carried forward. The figures of the drawings are not drawn to scale.

Before the present invention is disclosed and described, it is to be understood that the terminology used herein is for the purpose of describing particular embodiments only and is not intended to be limiting. The terms "a" or "an", as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically.

As used herein, the term "about" or "approximately" applies to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure.

Features and advantages of embodiments of the invention will be apparent from the following description of the drawings. Emphasis is placed upon illustrating the principles. The drawings are not to scale. Features of the embodiments may be combined with each other unless they exclude each other.

DETAILED DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 1 schematically illustrates a particle beam writing apparatus in accordance with an exemplary embodiment of the invention.

Figure 2:
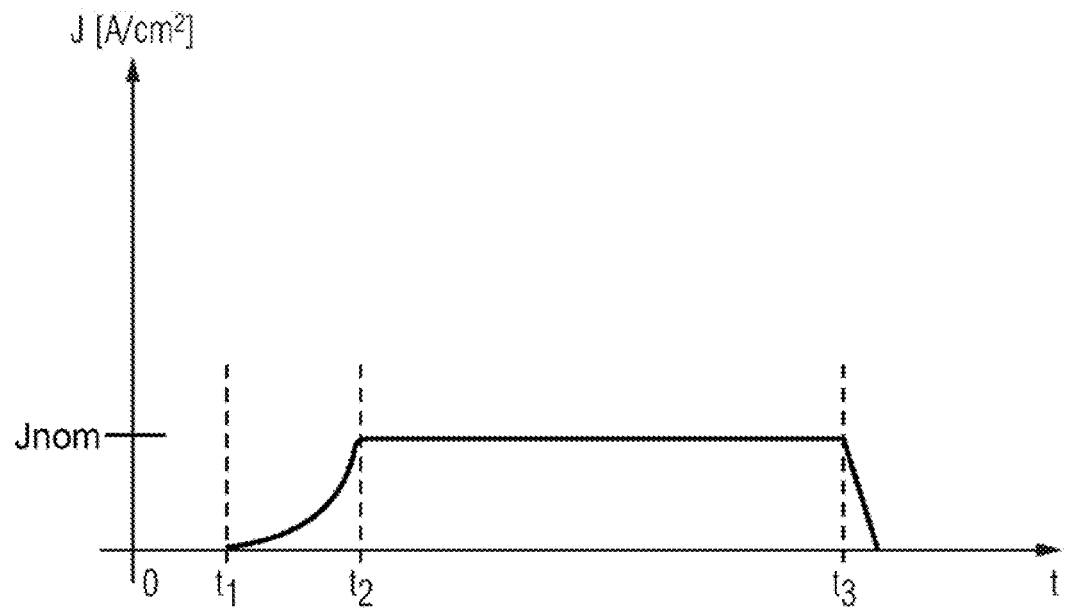

FIG. 2 is a diagram illustrating a current density of a particle beam as a function of time for illustrating a particle beam writing method in accordance with another exemplary embodiment.

Figure 3:
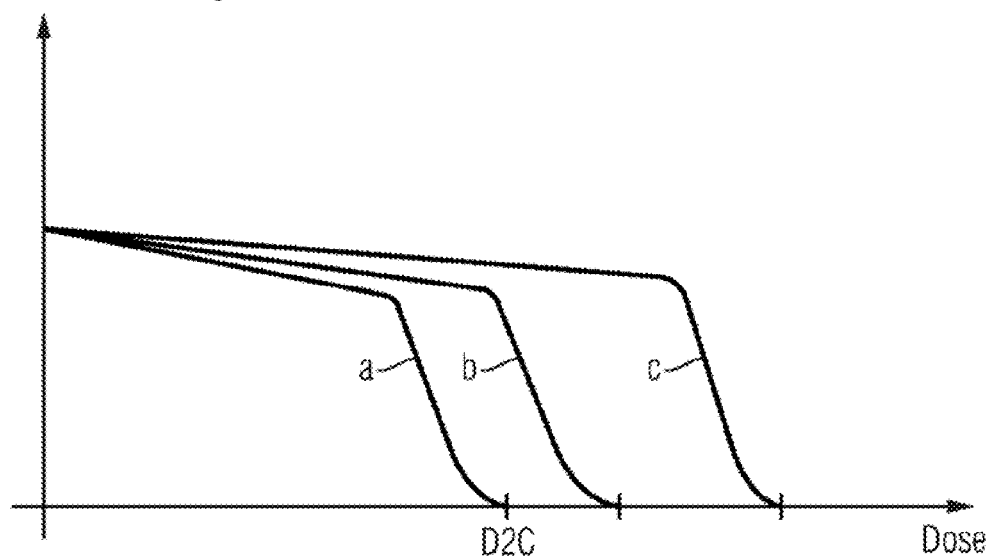

FIG. 3 schematically illustrates contrast curves for various exposure pass settings for illustrating a particle beam writing method in accordance with another exemplary embodiment of the invention.

Figure 4:
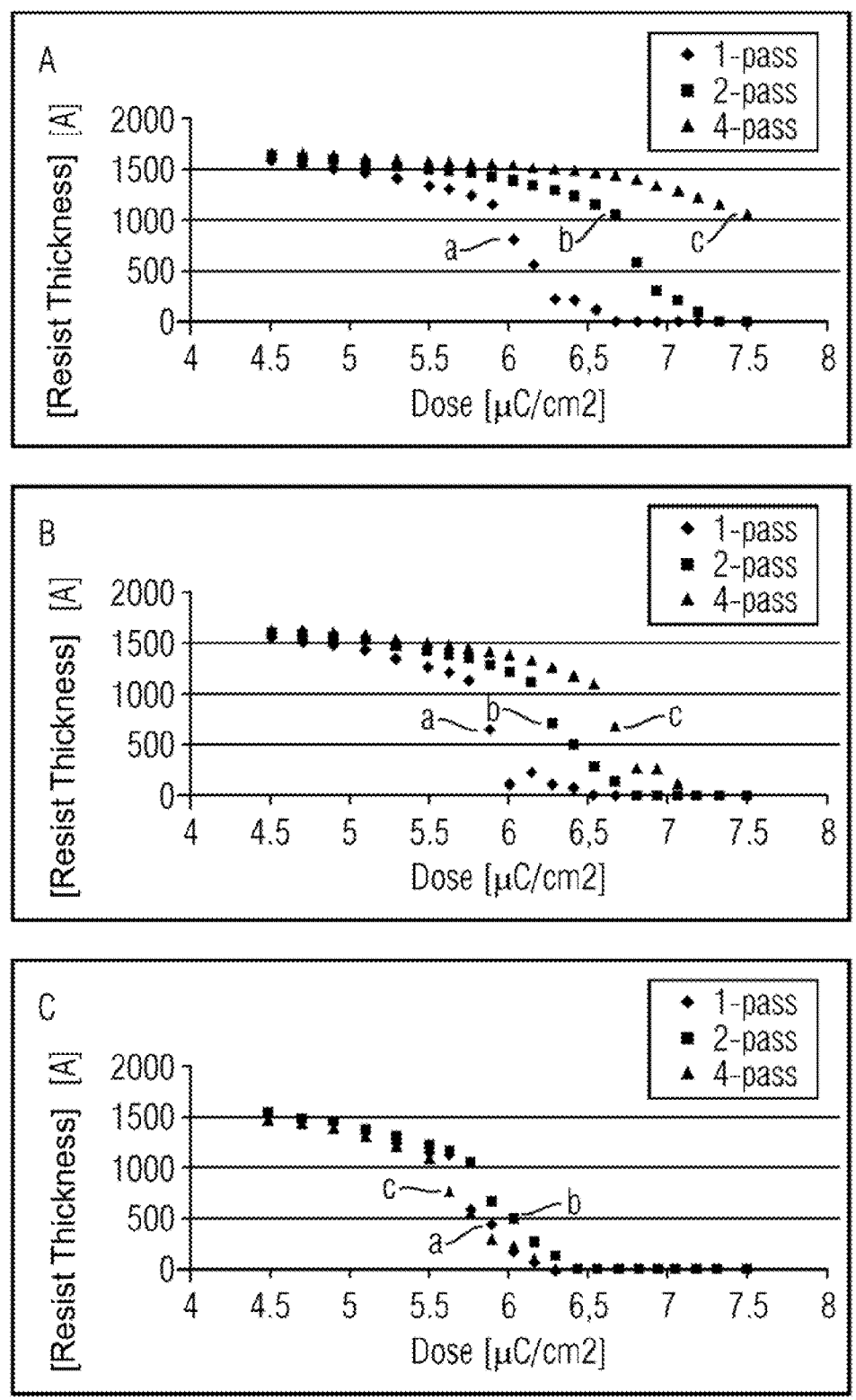

FIG. 4 refers to contrast curves experimentally obtained for selected shot time offsets for illustrating a particle beam writing method according to the embodiment of FIG. 3.

Figure 5:
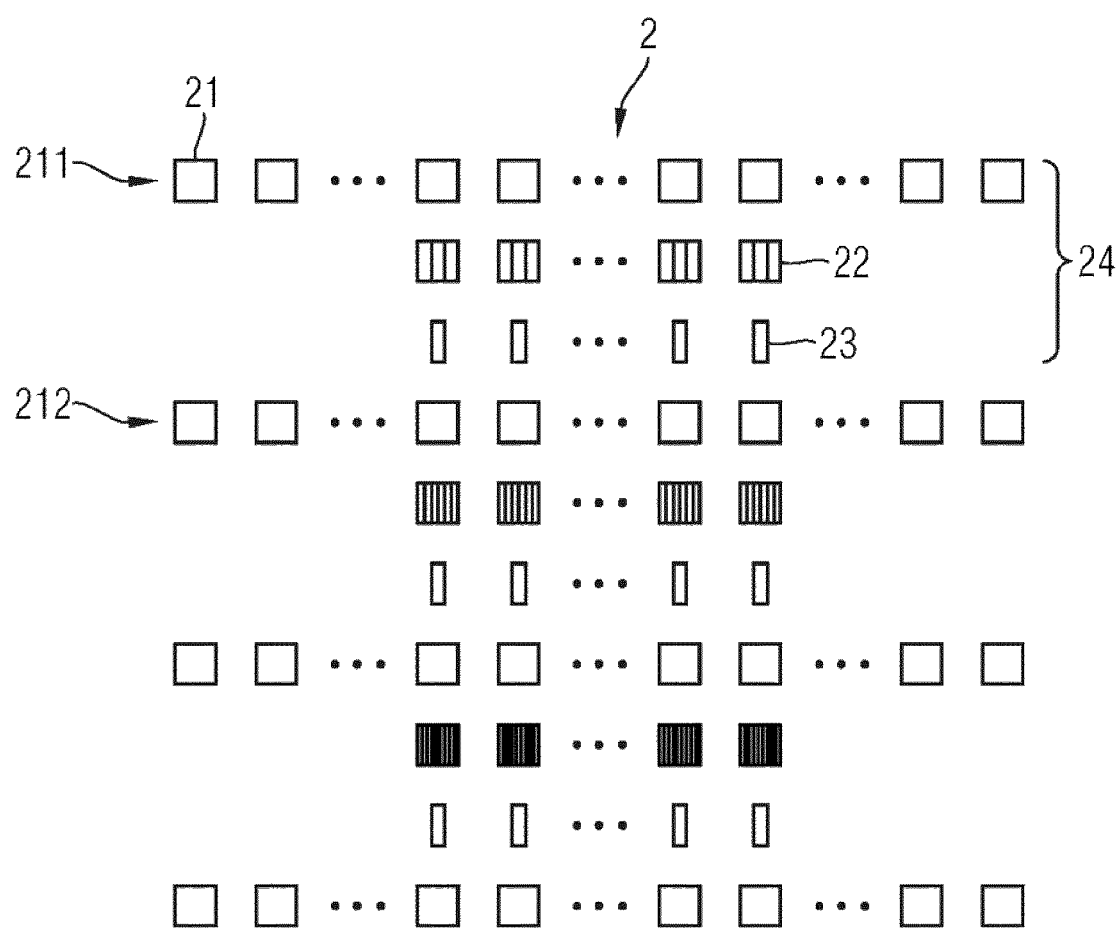

FIG. 5 illustrates a test pattern with a plurality of test structures in accordance with a further exemplary embodiment of the invention.

DETAILED DESCRIPTION OF THE INVENTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. Is to be understood that other embodiments may be utilized and structural or logical changes may be made without departing from the scope defined by the claims.

FIG. 1 is a simplified block diagram of a particle beam writing apparatus 1, which may be, for example, an electron or an ion beam writing apparatus. The particle beam writing apparatus 1 may include a tower-like housing, for example an electron lens barrel 12, and a process chamber 11. In the process chamber 11 a target substrate 18 may be placed on a stage 19, which is movable along two orthogonal axes that define a horizontal plane. The target substrate 18 may be, by way of example, a reticle, a wafer or a photomask and may include an ultra fine circuit pattern. Within the electron lens barrel 12, a beam generation, shaping and positioning unit, which may include a particle gun assembly 13 configured to generate a particle beam 15, a blanking deflector 16 configured to deflect the particle beam 15, and a blanking aperture plate 17, may be disposed. The blanking aperture plate 17 has an opening and a shield portion surrounding the opening, wherein the shield portion is configured to shield the target substrate 18 from the particle beam 15.

A control unit 14 is configured to control a blanking function of the blanking deflector 16 and the blanking aperture plate 17. Within a first time period, during which the particle beam 15 is directed to the target substrate 18, the blanking function is turned off and the particle beam 15 travels along an approximately vertical orbit indicated by the continuous line through the opening in the blanking aperture plate 17 to the target substrate 18. Within a second time period, during which the particle beam 15 is not directed to the target substrate 18, the blanking function is turned on and the particle beam 15 is directed along an angled or tilted orbit indicated by the dotted line to the shield portion of the blanking aperture plate 17.

Based upon layout data of a pattern to be transferred to the target substrate, a pattern generator 10 calculates a first exposure dose for a shot area, i.e., an area of the target substrate 18 that is exposed to the particle beam 15 during a shot, which may be a single shot, by way of example. According to an embodiment, the control unit 14 is configured to apply a total dose which includes the first exposure dose and a correction dose that compensates dose reductions between a first point in time at which the control unit 14 considers a charged particle beam 15 as having reached a nominal current density, and a second point of time at which the particle beam has actually reached the nominal current density value. In accordance with an embodiment, the control unit 14 may be configured to adapt the current intensity in order to apply the correction dose. In accordance with other embodiments, the control unit 14 may be configured to calculate a second shot time based upon a first shot time, which is calculated based upon the layout data and an offset time, wherein the offset time is a correction value that compensates a current density deviation from the nominal current density Jnom between a first point in time at which the blanking function turns off and the particle beam current density is considered as having reached a nominal current density Jnom and a second point in time at which the particle beam current density has actually reached the nominal current density Jnom at the target substrate.

FIG. 2 schematically illustrates the time-dependency of a current density J of a particle beam. At a first point in time $t_1$, the blanker function is turned off and the particle beam begins to move from a blanking position on the shield portion of the blanking aperture plate towards the opening in the blanking aperture plate. At a second point in time $t_2$ the particle beam has just reached the ideal exposure position and its nominal current density. Between the first point in time $t_1$ and the second point in time $t_2$, the current density J at the surface of the target substrate rises from 0 to the nominal current density Jnom. During the time interval $t_2-t_1$ a lower current density is effective than assumed by the control unit 14, for example since the particle beam has a finite cross-sectional area which needs some time for completely crossing the edge of the opening in the blanking aperture plate. As a result, less dose is deposited than stipulated by the pattern generator. The current density J is approximately stable up to a third point in time $t_3$ at which the blanker function is started and the particle beam starts to move back to the shielding position again. From the third point in time $t_3$, the current density J falls to 0 within a finite time period.

The pattern generator calculates the required exposure dose for each shot area based upon the respective layout data. The control unit, which may be, by way of example, a separate software module running at the same or at another processing apparatus as the pattern generator, or which may be integral part of the pattern generator, calculates a first shot time period ts based upon the required exposure dose d, the nominal current density Jnom and the relationship d=ts× Jnom, wherein the first shot time period ts is the time interval between the first point of time $t_1$ and the third point of time $t_3$. Less of a dose than stipulated by the pattern generator is deposited because between $t_1$ and $t_2$ the current density is lower than the nominal current density. The dose applied after $t_3$ may partly compensate the dose loss.

In accordance with an embodiment, the target substrate is exposed to a second exposure dose that is the sum of the first exposure dose and a correction dose, which compensates the dose loss between $t_1$ and $t_2$. For example, a shot time offset ts0 may be set, by which the first shot time is to be extended to compensate the dose loss. The shot time offset may be determined based upon the nominal current density and the correction dose. The respective shot area may be exposed for a second shot time, which is the sum of the calculated first shot time and the shot time offset.

The correction dose may be determined based upon contrast curves as illustrated in FIG. 3. Each contrast curve plots a remaining resist thickness for a series of test structures after exposure and development as a function of the exposure dose. Each contrast curve is assigned to another exposure pass setting.

The exposure time period may be fragmented in multiple time fragments and the calculated dose for each shot area may be applied in more than one shot. The shots assigned to the same shot area may follow directly to each other, or one or more complete stripes of the target substrate, or fragments of one or more stripes may be exposed before the same shot area is exposed a second time. The number of time fragments defines the number of exposure passes, during which the structures to be written in the resist material are exposed. For example, for a two-pass exposure, shot areas disposed along a line may be exposed sequentially for a first time fragment in course of a first pass and, later, they may be exposed for a second time fragment in course of a second pass. A first contrast curve a for a first test structure may be determined using a first number of exposure passes. For a second test structure, a second number of exposure passes is used and a second contrast curve b is determined. Then, the correction dose is calculated based upon a difference between the first and the second contrast curves a, b and based upon a difference between the first and the second number of exposure passes. For example, the second test structure may have the shape and size of the first test structure or a shape and size equivalent to that of the first test structure.

For each number of exposure passes, the resist thickness decreases with increasing dose. With increasing number of exposure passes, the total dose required for the same resist removal increases. A dose-to-clear D2C, which is defined as the minimum dose required for a complete removal of the resist and which corresponds to the dose at which the respective curve reaches the abscissa, depends on the number of exposure passes and increases with increasing number of exposure passes approximately linearly.

For example, the first contrast curve a is obtained from a one-pass exposure, wherein the exposure time period is not fragmented and the total dose is applied in one single shot. The second contrast curve b may be obtained from a two-pass exposure, wherein the exposure time period is fragmented into two fragments of, for example, the same length. A third curve c in FIG. 3 may refer to a four-pass exposure. The correction dose may be calculated based upon curves a and b, or a and c, or b and c, by way of example.

Referring to FIG. 5, in accordance with an embodiment, the first and the second test structures 211, 212 may be two series of equivalent or similar test features 21, for example large squares, which may be disposed along lines. Each series 211, 212 is exposed with a dose that changes from test feature to test feature. The two series 211, 212 are exposed with similar dose variations but with different exposure pass settings. Then the contrast curves for the two exposure pass settings may be derived from measuring remaining resist thicknesses for the respective doses after developing the resist material. In accordance with other embodiments, simply the respective dose-to-clear is determined by identifying for each series that test feature 21 of those test features with completely removed resist, to which the lowest dose has been applied.

According to other embodiments, each series of test structures may be arranged in a plurality of lines and/or rows or may be arbitrarily distributed on the target substrate. Other structures may be defined between test structures assigned to the same series. In accordance with further embodiments, the test structures may be rectangles or lines.

In accordance with a further embodiment, the correction dose may be determined based upon a difference between a first dose-to-clear for a series 211 of test features 21 and a second dose-to-clear for a second series 212 of test features 21, wherein for the exposure of the first and the second pluralities 211, 212 different exposure passes are used. As yet described with regard to FIG. 3, the dose-to-clear depends on the number of exposure passes and increases with increasing number of exposure passes approximately linearly.

From the dose-to-clear D2CM required in case of M exposure passes and the dose-to-clear D2CN required for N exposure passes, the required correction dose Dcorr may be calculated using equation (1):

$$D\text{corr}=(D2CM-D2CN)/(M-N) \quad \text{equation (1)}$$

From the correction dose and the nominal current density Jnom of the particle beam, the shot time offset ts0, by which the shot time ts is to be expanded, can be derived using equation (2):

$$ts0=D\text{corr}/J\text{nom} \quad \text{equation (2)}$$

FIGS. 4A to 4C illustrate contrast curves obtained from experimental data, wherein curves a result from a one-pass exposure, curves b from a two-pass exposure, and curves c from a four-pass exposure, respectively. The curves illustrated in FIG. 4A refer to a programmed shot time offset of −5 ns, the curves in FIG. 4B to a programmed shot time offset of 0 ns and the curves in FIG. 4C to a programmed shot time offset of +5 ns. The dose-to-clear depends on the programmed shot time offset, wherein with a programmed shot time offset of +5 ns, approximately the same dose-to-clear results for all exposure pass settings. For the same particle beam writing apparatus a shot time offset of 5 nanoseconds was calculated with the method described above The above-described method for calculating the shot time may be used for monitoring a charged particle beam apparatus. For example, the doses-to-clear for various exposure pass settings may be easily and quickly determined according to the above-mentioned method and may be compared to a previously determined nominal data (signature) of the respective particle beam writing apparatus. Any deviation from the nominal data indicates an increase or decrease of the effective dose applied by the particle beam apparatus. The determination of the second shot time may be repeated in maintenance intervals of several weeks or months and the current results may be compared with previously determined second shot times in order to reassess the quality of shot timing. A time dependent drift of the shot times may be evaluated.

Another embodiment of a particle beam writing method refers to the determination of a settle time period accommodating a particle beam stabilization period after a pre-positioning of the particle beam. For example, movable parts of the particle beam writing apparatus, e.g. the beam generation, shaping and positioning unit or the stage, or the particle beam have to come to rest, or a post-oscillation of the movable parts or the particle beam must decay, before the particle beam is stable. During the settle time period, the particle beam is blanked and directed to the shield portion of the blanking aperture plate. The settle time period starts at a first point in time at which the particle beam is pre-positioned and switched on. After expiration of the user-defined settle time period at a second point in time, the blanking of the particle beam is terminated, the particle beam is directed through the opening in the blanking aperture plate to the shot area on the target substrate and the shot time is started.

According to an embodiment, the user-defined settle time period is determined such that a previous exposure of an adjacent shot area has approximately no impact on the exposure of the currently exposed shot area. In this respect "approximately no impact" means that the previously exposure does not influence the actual or current exposure in a perceivable manner. Alternatively, the influence is just tolerable which means that the previous exposure does not impair or affect the current exposure in a perceivable manner. For example, the resist sensitivity may be influenced by heat dissipated from the previously exposed shot area and the settle time period is selected such that the sensitivity of the resist material is approximately homogenous in each shot area. As a consequence, a particle beam-induced modification in the resist film may be approximately independent from a distance to a previously exposed shot area. The methods of determining the settle time period and the shot time offset time may be used alternatively or cumulatively. In accordance with an embodiment both methods may be combined in order to increase the particle beam writer throughput. In accordance with other embodiments, only one of these methods may be performed.

For determining a suitable settle time period and/or a shot time offset, a test pattern 2 as illustrated in FIG. 5 may be used. The test pattern 2 may include a plurality of test structures 211, 212, wherein each test structure contains a series of identical or similar test features 21. The test structures 211, 212 may be exposed using a predefined exposure pass setting and different settle time settings. Within each test structure, each test feature 21 may be exposed at different doses. According to an embodiment, the test features 21 may be arranged along a line and the dose applied to the test features 21 may increase or decrease along the line. After exposure and resist development, the remnant resist patterns are evaluated. For example, on the target substrate a resist thickness gradient within the areas assigned to the test features 21 is determined. In accordance with other embodiments, the areas assigned to test features 21 that are exposed at a dose near to the respective dose-to-clear may be identified and optically inspected. A suitable settle time may be determined by identifying the shortest settle time setting, at which one of the test structures at a critical dose, for example near the dose-to-clear, shows yet negligible resist thickness variations. In accordance with another embodiment, the suitable settle time may correspond to the shortest settling time setting of those test structures that show the lowest number of partially resist-covered shot areas. The same test pattern may be used for determining the shot time offset and the settle time period.

According to an embodiment, the settle time period is determined such that a previous exposure of an adjacent shot area has no impact on the exposure of the currently exposed shot area. As a consequence, shots which are exposed with identical or similar settings, like shape, size, position and dose will give identical results on the target substrate.

The settle time may be determined accordingly for various exposure pass settings and various types of test features, wherein the dimensions of the test features may correspond to dimensions of critical features (CD, critical dimension).

According to an embodiment, the test pattern 2 may further include series of dense line/space patterns 22 and a series of isolated lines 23. After exposure and resist development, the CDs, line edge roughness, line width roughness and the remaining resist film thicknesses of the test features may be evaluated, for example measured, as a function of applied doses and exposure pass settings. For example, one series of squares, one series of dense line/space patterns 22 and one series of isolated lines 23 may form a set, wherein a plurality of sets 24 may be exposed with different exposure pass settings to study the effect of various exposure pass settings and/or offset time settings and/or settle time settings, by way of example.

According to an embodiment, the test features may be squares of 200×200 $\mu m^2$ spaced at 100 $\mu m$. The series of dense line/space patterns 22 may include 10 patches of 200× 200 $\mu m^2$ spaced at 100 $\mu m$ and line widths of 800 nm, 320 nm, 180 nm with increasing line density from set 24 to set 24. The series of isolated lines 23 may include 10 isolated lines with lw×200 $\mu m^2$ spaced at 100 $\mu m$, wherein lw may be 800 nm, 320 nm, 180 nm, by way of example.

By exposing the sets 24 with different exposure pass settings and various settling times, it is possible to study the impact of the settling time on the dose-to-clear, the dose latitude for various feature types and CDs, the impact on proximity error correction and the impact on line edge roughness.

While embodiments of the invention have been described above, it is obvious that further embodiments may be implemented. Accordingly, this spirit and scope of the appended claims should not be limited to the description of the embodiments contained herein.

The invention claimed is:

1. A particle beam writing method, comprising:
   determining a first exposure dose for a shot area based upon layout data;
   determining a correction dose compensating a dose deviation between a first point in time, at which a blanking function is turned off, and a second point in time, at which the particle beam has reached a nominal current density at a target substrate, the determination of the correction dose comprising:
      determining a first contrast curve for a first test structure in a resist material using a first number of exposure passes;
      determining a second contrast curve for a second test structure in the resist material using a second number of exposure passes different from the first number of exposure passes; and
      determining the correction dose based upon a difference between the first and second contrast curves and a difference between the first and second numbers of exposure passes.

2. The method of claim 1, further comprising:
   determining a correction time based upon the correction dose and the nominal current density.

3. The method of claim 1, further comprising
   exposing the target substrate to a particle beam having a second exposure dose that is the sum of the first exposure dose and the correction dose.

4. The method of claim 1, further comprising:
   determining a first shot time based upon the first exposure dose and the nominal current density;
   determining a correction time based upon the correction dose and the nominal current density;
   exposing the target substrate to a particle beam having the nominal current density for a second shot time being equal to the sum of the first shot time and the correction time.

5. The method of claim 1, wherein:
   the first test structure is a plurality of a first test structures;
   the second test structure is a plurality of a second test structures; and
   the correction dose is determined based upon a difference between a first dose-to-clear for the first test structures, and a second dose-to-clear for the second test structures.

6. The method of claim 1, further comprising:
   determining a settle time period between a third point in time, at which the particle beam is blanked, and the first point in time such that exposure of a first shot area has approximately no impact on the exposure of a second shot area exposed subsequently.

7. The method of claim 6, wherein the exposure of the first shot area has no impact on the exposure on the second shot area.

8. The method of claim 6, wherein, in the second shot area, a particle beam induced modification in the resist film is independent from a distance to the first shot area.

9. The method of claim 6, wherein determining the settle time period comprises:
   exposing a resist film with a particle beam according to a test pattern that comprises a plurality of series of test features, wherein the series are exposed at different settle time settings and wherein within each series different doses are applied to each test feature;
   thereafter developing the resist film; and
   thereafter measuring resist thickness variations within shot areas assigned to the test features.

10. The method of claim 4, wherein determining of the second shot time is repeated in maintenance intervals; and further comprising evaluating a time dependent drift of the second shot times.

11. A particle beam apparatus monitoring method comprising:
   determining a first exposure dose for a shot area based upon layout data;
   determining a correction dose compensating a dose deviation between a first point in time, at which a blanking function is turned off, and a second point in time at which the particle beam has reached a nominal current density at a target substrate, the determination of the correction dose comprising:

determining a first contrast curve for a first test structure in a resist material using a first number of exposure passes;

determining a second contrast curve for a second test structure in the resist material using a second number of exposure passes different from the first number of exposure passes;

determining the correction dose based upon a difference between the first and second contrast curves and a difference between the first and second numbers of exposure passes.

12. The method of claim 11, further comprising:

determining a correction time from the correction dose and the nominal current density.

13. A charged particle beam writing method, comprising:

determining a settle time period between a first point in time, at which a particle beam is blanked, and a second point in time, at which a shot time for a shot area starts, such that exposure of a first shot area has approximately no impact on the exposure of a second shot area exposed subsequently.

14. The method of claim 13, wherein the exposure of the first shot area has no impact on the exposure on the second shot area.

15. The method of claim 13, wherein, in the second shot area, a particle beam induced modification in the resist film is independent from a distance to the first shot area.

16. The method of claim 15, wherein determining the settle time period comprises:

exposing a resist film with a particle beam according to a test pattern that comprises a plurality of series of test features, wherein the series are exposed at different settle time settings and wherein within each series different doses are applied to each test feature;

thereafter developing the resist film; and thereafter measuring resist thickness variations within shot areas assigned to the test features.

* * * * *